United States Patent
Kim et al.

(10) Patent No.: US 9,711,585 B2
(45) Date of Patent: Jul. 18, 2017

(54) ORGANIC LIGHT EMITTING DIODE DISPLAY

(71) Applicant: SAMSUNG DISPLAY CO., LTD., Yongin-si, Gyeonggi-do (KR)

(72) Inventors: Yong Chul Kim, Asan-si (KR); Dong-Yoon So, Asan-si (KR); Tae Gon Kim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/871,631

(22) Filed: Sep. 30, 2015

(65) Prior Publication Data

US 2016/0260792 A1    Sep. 8, 2016

(30) Foreign Application Priority Data

Mar. 4, 2015  (KR) .......................... 10-2015-0030561

(51) Int. Cl.
*H01L 27/32* (2006.01)
*H01L 51/52* (2006.01)

(52) U.S. Cl.
CPC ...... *H01L 27/3276* (2013.01); *H01L 27/3211* (2013.01); *H01L 27/3244* (2013.01); *H01L 27/3262* (2013.01); *H01L 51/5209* (2013.01); *H01L 27/3218* (2013.01); *H01L 27/3246* (2013.01); *H01L 2251/301* (2013.01); *H01L 2251/5338* (2013.01); *H01L 2251/5392* (2013.01); *H01L 2251/568* (2013.01)

(58) Field of Classification Search
CPC ............ H01L 27/3276; H01L 27/3244; H01L 27/3246; H01L 27/3211; H01L 27/3262; H01L 51/5203; H01L 2251/5338; H01L 2251/568

See application file for complete search history.

(56) References Cited

U.S. PATENT DOCUMENTS

| | | | |
|---|---|---|---|
| 7,858,974 B2* | 12/2010 | Yoon | H01L 27/3265 257/290 |
| 8,283,860 B2* | 10/2012 | Oh | H01L 27/3246 313/500 |
| 8,431,930 B2* | 4/2013 | Park | H01L 27/3246 257/59 |

(Continued)

FOREIGN PATENT DOCUMENTS

| KR | 2002-0030897 A | 4/2002 |
|---|---|---|
| KR | 10-0986845 B1 | 10/2010 |

(Continued)

*Primary Examiner* — Michael Trinh
(74) *Attorney, Agent, or Firm* — Lewis Roca Rothgerber Christie LLP

(57) ABSTRACT

An organic light emitting diode display according to an example embodiment of the present invention includes: a substrate; a scan line and a data line that are insulated from one another and crossing each other on the substrate; a first transistor on the substrate and connected to the scan line and the data line; a second transistor connected to the first transistor; a first electrode connected to the second transistor and having a cutout; an organic emission layer on the first electrode; and a second electrode on the organic emission layer, wherein the cutout is at a position corresponding to the data line.

10 Claims, 12 Drawing Sheets

(56) References Cited

U.S. PATENT DOCUMENTS

2013/0063330 A1\* 3/2013 Eom .................. H01L 27/3211
                                                      345/80
2013/0257839 A1\* 10/2013 Hyeon .................. G06F 3/038
                                                      345/212

FOREIGN PATENT DOCUMENTS

KR  10-2013-0023642 A  3/2013
KR  10-2014-0007688 A  1/2014

\* cited by examiner

ORGANIC LIGHT EMITTING DIODE DISPLAY

CROSS-REFERENCE TO RELATED APPLICATION

This application claims priority to and the benefit of Korean Patent Application No. 10-2015-0030561, filed in the Korean Intellectual Property Office on Mar. 4, 2015, the entire content of which is incorporated herein by reference.

BACKGROUND

1. Field

Aspects of embodiments of the present invention relate to a display device.

2. Description of the Related Art

An organic light emitting diode display includes two electrodes and an organic light emitting layer positioned there between. Electrons injected from a cathode that is an electrode and holes injected from an anode that is another electrode are bonded to each other in the organic light emitting layer to form excitons. Light is emitted when the excitons discharge energy.

Organic light emitting diode displays include a plurality of pixels including an organic light emitting diode formed of the cathode, the anode, and the organic light emitting layer. A plurality of thin film transistors and capacitors for driving the organic light emitting diode are formed in each pixel.

Pixel defects may be generated due to a characteristic deviation of a transistor and a capacitor provided in each pixel or a short or a disconnection of wirings. In this case, a connection wiring between the pixel circuit portion and the organic light emitting diode of the defective pixel may be disconnected to be a black pixel, and thereby is not recognized as a bright point.

To create the black pixel, all signal lines connected to the defective pixel may be disconnected, and the data line connected to the defective pixel may also disconnected. However, because the data line is connected to the plurality of normal pixels as well as the defective pixel, the data line connected to the defective pixel may be disconnected and then a detour path detouring the data signal may formed such that the data signal may be applied to the normal or non-defective pixels.

For example, a connection bridge connecting a part of the signal line applied with a constant voltage and the disconnected portion of the data line may form the detour path. Such a connection bridge may be formed by sputtering tungsten or the like. When tungsten is over-deposited, however, the connection bridge may be formed to protrude more than other portions. Such protrusions due to the over-deposition may increase the possibility of a short circuit with other metals or conductive materials such as the pixel electrode positioned on the connection bridge, thereby causing a new pixel defect.

The above information disclosed in this Background section is only to enhance the understanding of the background of the present invention, and therefore it may contain information that does not constitute prior art.

SUMMARY

Aspects of embodiments of the present invention relate to a display device and an organic light emitting diode display.

According to aspects of embodiments of the present invention, instances of short circuits with an overlying conductive layer in an organic light emitting diode display may be prevented or reduced even in instances where there is an over-deposition of conductive material when forming a connection bridge with a data line.

According to some example embodiments of the present invention, an organic light emitting diode display includes: a substrate; a scan line and a data line that are insulated from one another and crossing each other on the substrate; a first transistor on the substrate and connected to the scan line and the data line; a second transistor connected to the first transistor; a first electrode connected to the second transistor and having a cutout; an organic emission layer on the first electrode; and a second electrode on the organic emission layer, wherein the cutout is at a position corresponding to the data line.

The organic light emitting diode display may further include: a pixel definition layer on the second transistor and having an opening exposing the first electrode, wherein the pixel definition layer overlaps the cutout and the organic emission layer is positioned in the opening.

The cutout may be concave from one edge of the first electrode to a center of the first electrode.

A boundary line of the cutout may be in a boundary line of the first electrode.

The organic light emitting diode display may further include: a driving voltage line or an initialization voltage line on the substrate and extending in a direction parallel to the data line, wherein the cutout corresponds to the driving voltage line or the initialization voltage line.

The driving voltage line or the initialization voltage line may form a mesh shape structure.

According to some example embodiments of the present invention, an organic light emitting diode display includes: a substrate including a plurality of pixels; a scan line and a data line insulated from one another and crossing each other on the substrate; a first transistor connected to the scan line and the data line respectively formed in the pixel; a driving voltage line separated from the scan line and the data line and arranged in a mesh shape; a second transistor formed in each pixel and connected to the first transistor and the driving voltage line; a first electrode connected to the second transistor and having a cutout at a position corresponding to the data line; an organic emission layer on the first electrode; and a second electrode on the organic emission layer, wherein the first electrode of at least one pixel among the pixels is electrically isolated from the second transistor, the data line overlapping the first electrode has a first position and a second position configured to be divided by a laser, the driving voltage line connected to the second transistor has a third position and a fourth position configured to be divided by a laser, and both ends of a detour pattern positioned between the third position and the fourth position are respectively configured to be electrically connected to the ends of the data line positioned at the first position and the second position by a first connection bridge and a second connection bridge.

The connection bridge may be formed of tungsten.

A portion in which one end of the connection bridge and one end of the data line are configured to be connected may be at the cutout.

According to aspects of some embodiments of the present invention, by forming the cutout in an anode, when forming a detour path by using a connection bridge, even though metal or conductive material of the detour path may be over-deposited, instances of a short circuit between the over-deposited material and the anode of the organic light emitting diode display may be reduced or prevented.

DETAILED DESCRIPTION

Figure 1:
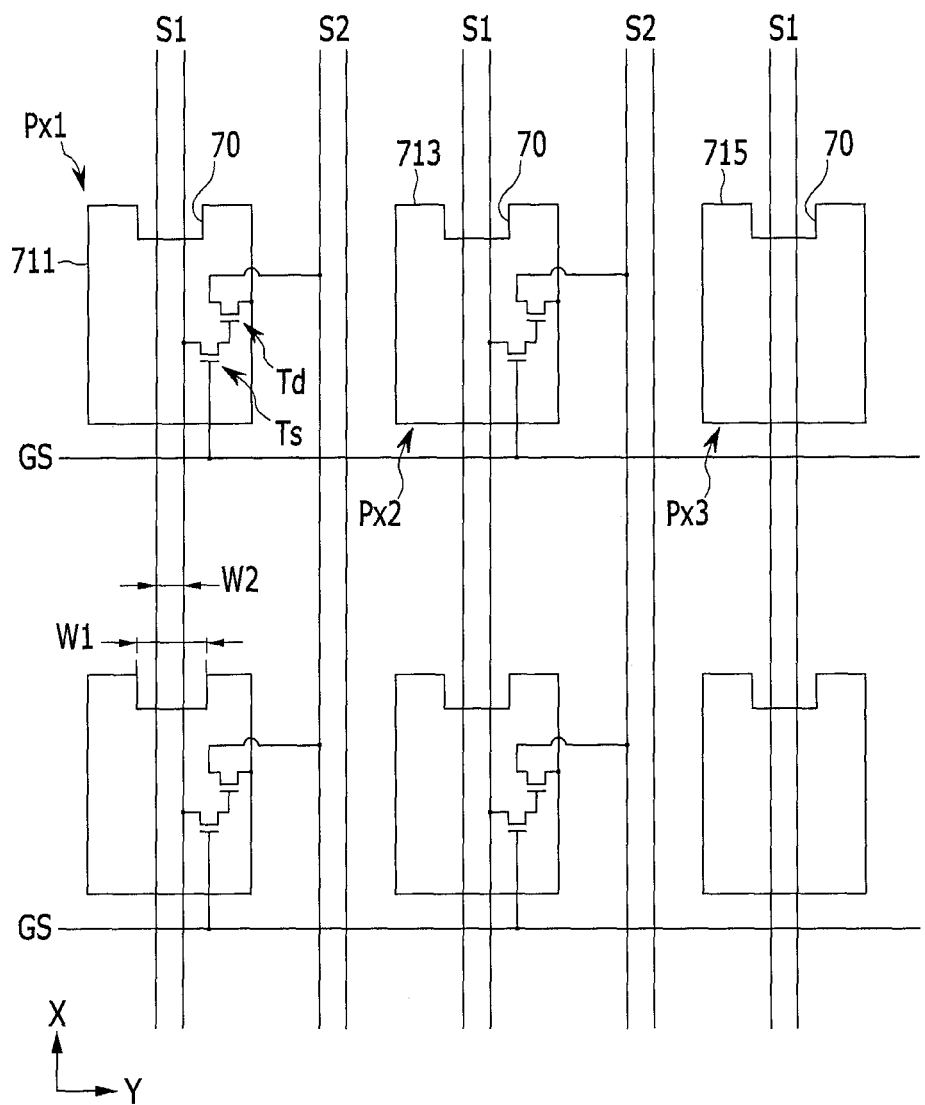
FIG. 1 is a schematic layout view of a plurality of pixels of an organic light emitting diode display according to some example embodiments of the present invention.

Several example embodiments according to the present invention are described hereinafter in detail with reference to the accompanying drawings in order to be easily understood by a person of ordinary skill in the art. The present invention can be embodied in several different forms, and is not limited to the example embodiments that are described herein.

In order to clarify the present invention, some aspects of the invention that are not connected with the description will be omitted, and the same elements or equivalents are referred to by the same reference numerals throughout the specification.

In addition, the size and thickness of each element shown in the drawings are arbitrarily shown for better understanding and ease of description, but the present invention is not limited thereto. In the drawings, the thickness of layers, films, panels, regions, etc., are exaggerated for clarity. In the drawings, for better understanding and ease of description, the thicknesses of some layers and areas are exaggerated.

In addition, unless explicitly described to the contrary, the word "comprise" and variations such as "comprises" or "comprising", will be understood to imply the inclusion of stated elements but not the exclusion of any other elements. It will be understood that when an element such as a layer, film, region, or substrate is referred to as being "on" another element, it can be directly on the other element or intervening elements may also be present. Further, in the specification, the word "on" refers to positioning above or below the object portion, but does not essentially mean positioning on the upper side of the object portion based on a gravitational direction.

Further, the number of thin film transistors (TFTs) and capacitors is not limited to the number illustrated in the accompanying drawings and an organic light emitting diode display may be formed in various structures in which one pixel may include a plurality of transistors and at least one capacitor and is further provided with a separate wiring or does not include the existing wirings. Here, the pixel refers to a minimum unit which displays an image and the organic light emitting device displays an image through a plurality of pixels.

Further, in this specification, the phrase "on a plane" refers to viewing a target portion from the top, and the phrase "on a cross section" refers to viewing a cross section formed by vertically cutting a target portion from the side.

Hereinafter, an organic light emitting diode display according to an example embodiment of the present invention will be described with reference to the accompanying drawings.

FIG. 1 is a schematic layout view of a plurality of pixels of an organic light emitting diode display according to an example embodiment of the present invention.

As shown in FIG. 1, pixels of an organic light emitting diode display according to an example embodiment of the present invention are arranged in a matrix. Hereinafter, for ease of explanation, an X-axis direction is referred to as a row, and a Y-axis direction is referred to as a column.

The pixels may include a first pixel Px1, a second pixel Px2, and a third pixel Px3 emitting one among red, green, and blue, for example, the first pixel Px1 may be a red pixel, the second pixel Px2 may be a blue pixel, and the third pixel Px3 may be a green pixel.

The first pixel Px1, the second pixel Px2, and the third pixel Px3 respectively include a switching transistor Ts connected to a first signal line GS and a second signal line S1 and a driving transistor Td connected to a third signal line S2, and an organic light emitting element electrically connected to the driving transistor Td. The organic light emitting element includes first electrodes 711, 713, and 715 connected to the transistor through a contact hole, an organic emission layer formed on the first electrode, and a second electrode formed on the organic emission layer. Also, each pixel may include a storage capacitor Cst (see, e.g., FIG. 6).

A plane shape of the first electrodes 711, 713, and 715 of the first pixel Px1, the second pixel Px2, and the third pixel Px3 may be quadrangular with a substantially long column direction shape.

The first electrodes 711, 713, and 715 may overlap at least one signal line, e.g., the second signal line S1 applied with the data signal. In FIG. 1, a corresponding data line applied with a corresponding data signal is shown, however it is not limited thereto and they may overlap the data line applied with the data signal of other pixels.

Also, according to some embodiments, the first electrodes 711, 713, and 715 may overlap the third signal line S2 applied with a driving voltage. The third signal line S2 applied with the constant voltage such as the driving voltage may be formed of a mesh structure. This will be described with reference to FIG. 8.

According to the embodiment illustrated in FIG. 1, the third signal line S2 is applied with the driving voltage, however it is not limited thereto and it may be an initialization voltage line applied with an initialization voltage.

The first electrodes 711, 713, and 715 have a cutout 70 exposing the signal line overlapping the first electrodes 711, 713, and 715. In FIG. 1, the first signal line S1 applied with the data signal is overlapped, however it is not limited thereto and the driving voltage line or and the initialization voltage line may be overlapped.

The cutout 70 may be formed to be concave from any one edge of the first electrodes 711, 713, and 715 toward the center of the first electrodes 711, 713, and 715. For example, the cutout may be formed to be concave from one edge of the first electrodes 711, 713, 715 of the direction (the x-axis direction) vertical to the signal line to the direction (the y-axis direction) parallel to the signal line.

According to some embodiments, a width W1 of the cutout may be larger than the width W2 of the signal line. The plane shape of the cutout 70 may be a quadrangle having an edge parallel to the signal line.

FIG. 2 to FIG. 5 are schematic layout views of a pixel of an organic light emitting diode display according to another example embodiment of the present invention.

The pixels of the organic light emitting diode display shown in FIG. 2 to FIG. 5 are similar or the same as the pixel of FIG. 1 such that only some of the differences will be described in detail.

Figure 2:
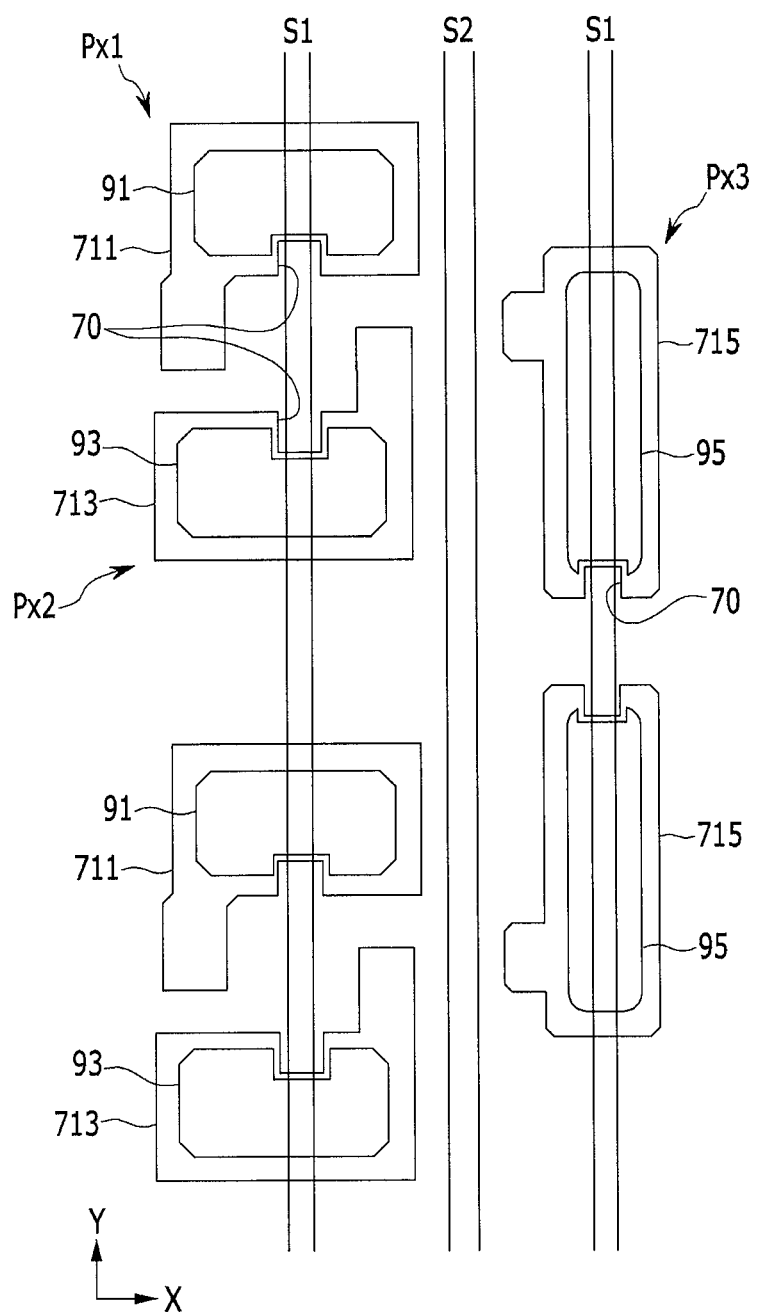
FIG. 2 to FIG. 5 are schematic layout views of a pixel of an organic light emitting diode display according to some example embodiments of the present invention.
Figure 3:
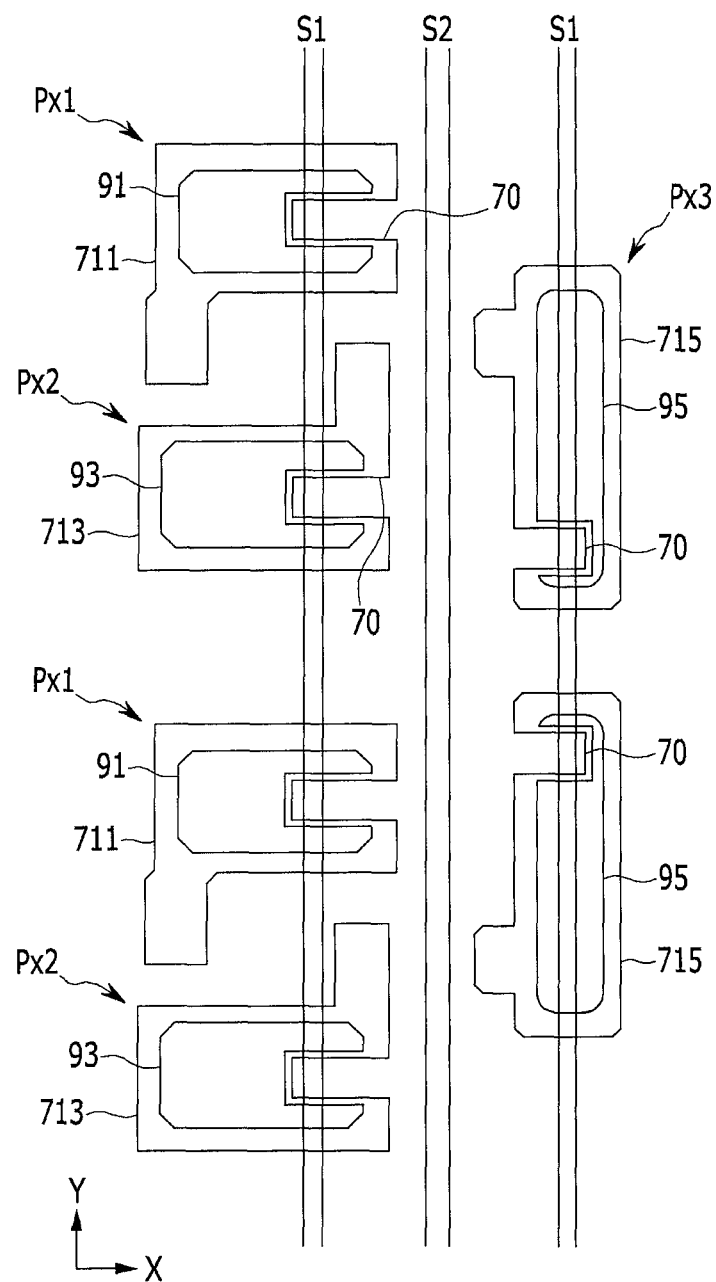
Figure 4:
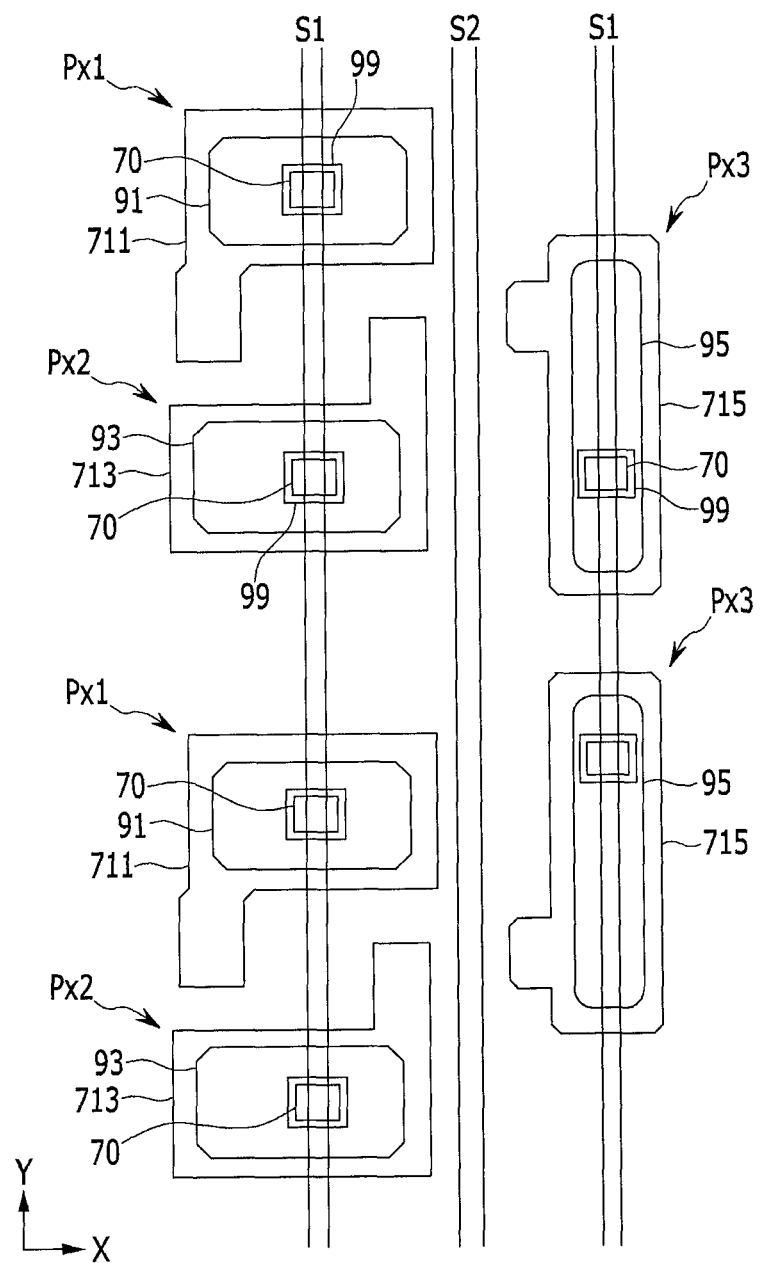

As shown in FIG. 2 to FIG. 4, the pixels of the organic light emitting diode display according to an example embodiment of the present invention may include the first pixel Px1, the second pixel Px2, and the third pixel Px3 emitting one of red, green, and blue, e.g., the first pixel Px1 may be the red pixel, the second pixel Px2 may be the blue pixel, and the third pixel Px3 may be the green pixel.

In the first column, the first pixel Px1 and the second pixel Px2 are alternately arranged (e.g., arranged in an alternating order) according to the column with a predetermined interval, in the second column, and the third pixel Px3 is arranged with a predetermined interval in the column direction.

The first pixel Px1, the second pixel Px2, and the third pixel Px3 respectively include the transistor and the organic light emitting element electrically connected to the transistor. The organic light emitting element includes the first electrodes 711, 713, and 715 connected to the transistor through the contact hole, the organic emission layer formed on the first electrode, and the second electrode formed on the organic emission layer.

The organic emission layer is positioned within the openings 91, 93, and 95 of the pixel definition layer having the openings 91, 93, and 95 exposing the first electrodes.

The plane shape of the first electrodes 711 and 713 of the first pixel Px1 and the second pixel Px2 may be a quadrangle with a substantially long row direction, and the plane shape of the first electrode 715 of the third pixel Px3 may be a quadrangle with a substantially long column direction.

The first electrodes 711, 713, and 715 of each pixel may be electrically connected to the transistor through the contact hole, and may have the protrusion extended from the first electrodes 711, 713, and 715 for easy connection.

The protrusion of the first pixel Px1 and the protrusion of the second pixel Px2 may protrude to face each other and the protrusion of the third pixel Px3 may protrude toward the second pixel Px2.

Accordingly, most of the first electrode 715 of the third pixel Px3 may be formed to alternately face the first electrode 711 of the first pixel Px1 and the first electrode 713 of the second pixel Px2.

Meanwhile, as shown in FIG. 1, the first electrode 711, 713, and 715 may overlap at least one of signal lines S1 and S2 formed in the column direction, and the first electrodes 711, 713, and 715 have the cutout 70 exposing the signal line overlapping the first electrodes 711, 713, and 715. In this case, the signal lines S1 and S2 may be one of the data line, the driving voltage line, or the initialization voltage line. The pixel definition layer may further include a portion overlapping the cutout 70.

Referring to FIG. 2, the cutout 70 may be formed to be concave from any one edge of the first electrodes 711, 713, and 715 toward the center of the first electrodes 711, 713, and 715. For example, the cutout may be formed to be concave from one edge of the first electrodes 711, 713, 715 of the direction (the x-axis direction) vertical to the signal line to the direction (the y-axis direction) parallel to the signal line.

According to some example embodiments, the width of the cutout is larger than the width of the signal line. The plane shape of the cutout may be a quadrangle having an edge parallel to the signal line.

Also, referring to FIG. 3, the cutout 70 may be formed to be concave from any one edge parallel to the signal lines S1 and S2 (the y-axis direction) to the direction (the x-axis direction) vertical to the signal lines S1 and S2.

In the above example embodiments, the cutout is formed to have the concave shape from any one edge toward the center of the first electrodes 711, 713, and 715, however it is not limited thereto, and as shown in FIG. 4, the cutout 70 may be positioned within the boundary line of the first electrodes 711, 713, and 715.

In FIG. 2 to FIG. 4, the cutout 70 is positioned at the region overlapping the signal lines S1 and S2 and the plane shape of the cutout 70 is formed to have an edge parallel to the signal line S1, so that the cutout 70 is approximately a quadrangle. However, it is not limited thereto and the cutout 70 may have various plane shapes of a polygon such as a circle or a triangle to expose the boundary line of the signal line.

Figure 5:
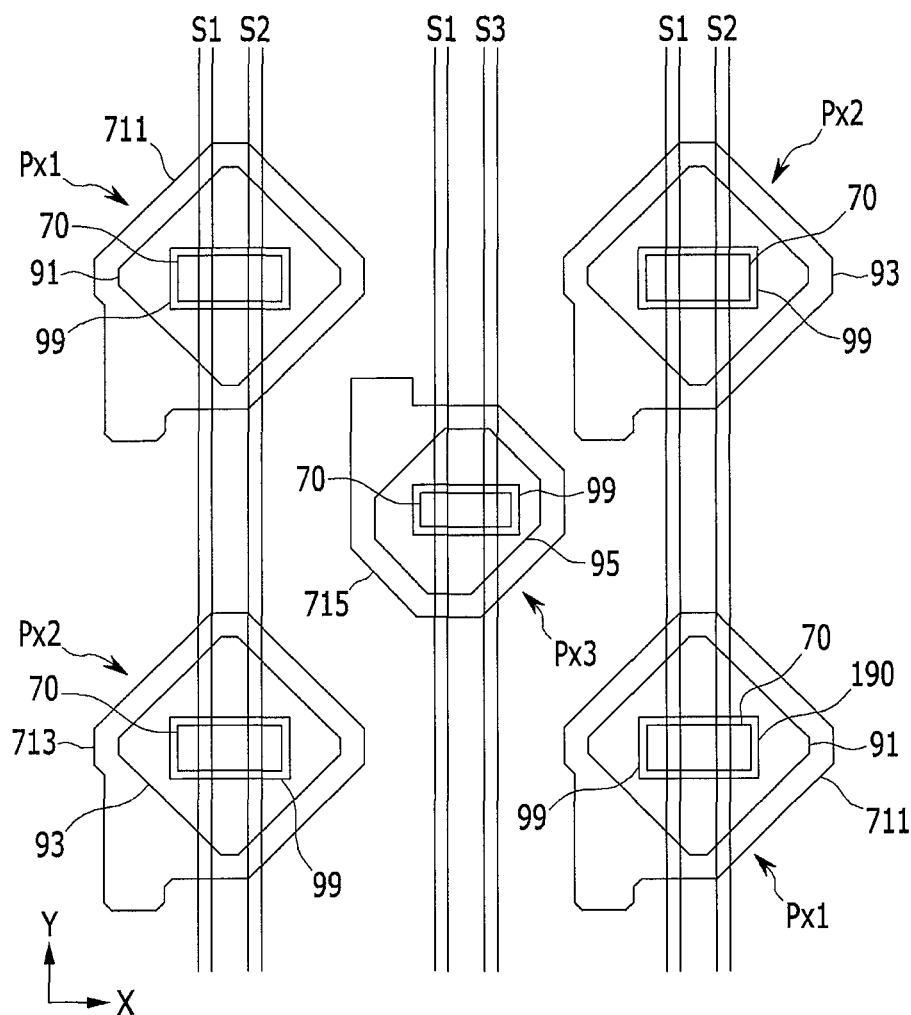

Meanwhile, referring to FIG. 5, the pixels may be arranged to form a pentile matrix.

The pixels of FIG. 5 are arranged in a matrix, the first pixel Px1 and the second pixel Px2 are alternately arranged (e.g., arranged in an alternating order) according to the column at a predetermined interval in the first column, and the third pixel Px3 may be continuously arranged at a predetermined interval according to the column in the second column.

The first to third pixels Px1, Px2, and Px3 may be one pixel among the red pixel, the blue pixel, and the green pixel, and the pixels of the same color may be positioned diagonally with respect to the third pixel Px3 positioned in the second column.

For example, the first pixel Px1 may be positioned to the upper left side and lower right side of the third pixel Px3 and the second pixel Px2 may be positioned to the upper right side and lower left side. In this case, the third pixel Px3 may be the green pixel, the first pixel Px1 may be the red pixel, and the second pixel Px2 may be the blue pixel.

This pixel arrangement structure is referred to as a pentile matrix, and a rendering driving representing the color while sharing the adjacent pixels is applied, thereby realizing high resolution through a small number of pixels.

The first electrodes 711, 713, and 715 of the pixel shown in FIG. 5 may overlap at least one of signal lines S1 and S2, and in FIG. 5, two signal lines are together overlapped.

The first electrodes 711, 713, and 715 have the cutout 70 exposing the signal lines S1 and S2 overlapping the first electrodes 711, 713, and 715. In this case, the signal lines S1 and S2 may be one among the data line, the driving voltage line, or the initialization voltage line.

The cutout 70 includes the cutout 70 positioned in the region overlapping the signal line and exposing the boundary line of the signal line. The boundary line of the cutout 70 is positioned within the boundary line of the first electrodes 711, 713, and 715, and the plane shape of the cutout may be a quadrangle having an edge parallel to the signal line, however it is not limited thereto and it may be formed of various shapes.

As shown in FIG. 1 to FIG. 4, the cutout 70 may be a shape concave to any one edge of the first electrodes 711, 713, and 715 toward the center of the first electrodes 711, 713, and 715.

The cutout 70 shown in the example embodiments of FIG. 2 to FIG. 5 may overlap the pixel definition layer. That is, as shown in FIG. 1 to FIG. 3, the portion of the pixel definition layer protrudes to the side of the opening to overlap the cutout 70, and as shown in FIG. 4 and FIG. 5, an isolated island pixel definition layer 99 may exist within the openings 91, 93, and 95. As shown in FIG. 1 to FIG. 3, when the pixel definition layer protrudes, the openings 91, 93, and 95 include the portion that is concave according to the shape of the cutout 70 due to the protrusion.

As described above, as in the example embodiments of the present invention, if the first electrodes 711, 713, and 715 are formed to have the cutout 70 exposing the signal line overlapping the first electrodes 711, 713, and 715, the first electrodes 711, 713, and 715 and the metal layer for the repairing may be prevented from being short-circuited in the repairing process due to the shorting of the signal line in the manufacturing process, which will be described in more detail below.

Next, the pixel of the described organic light emitting diode display will be described in more detail with reference to the drawings.

Figure 6:
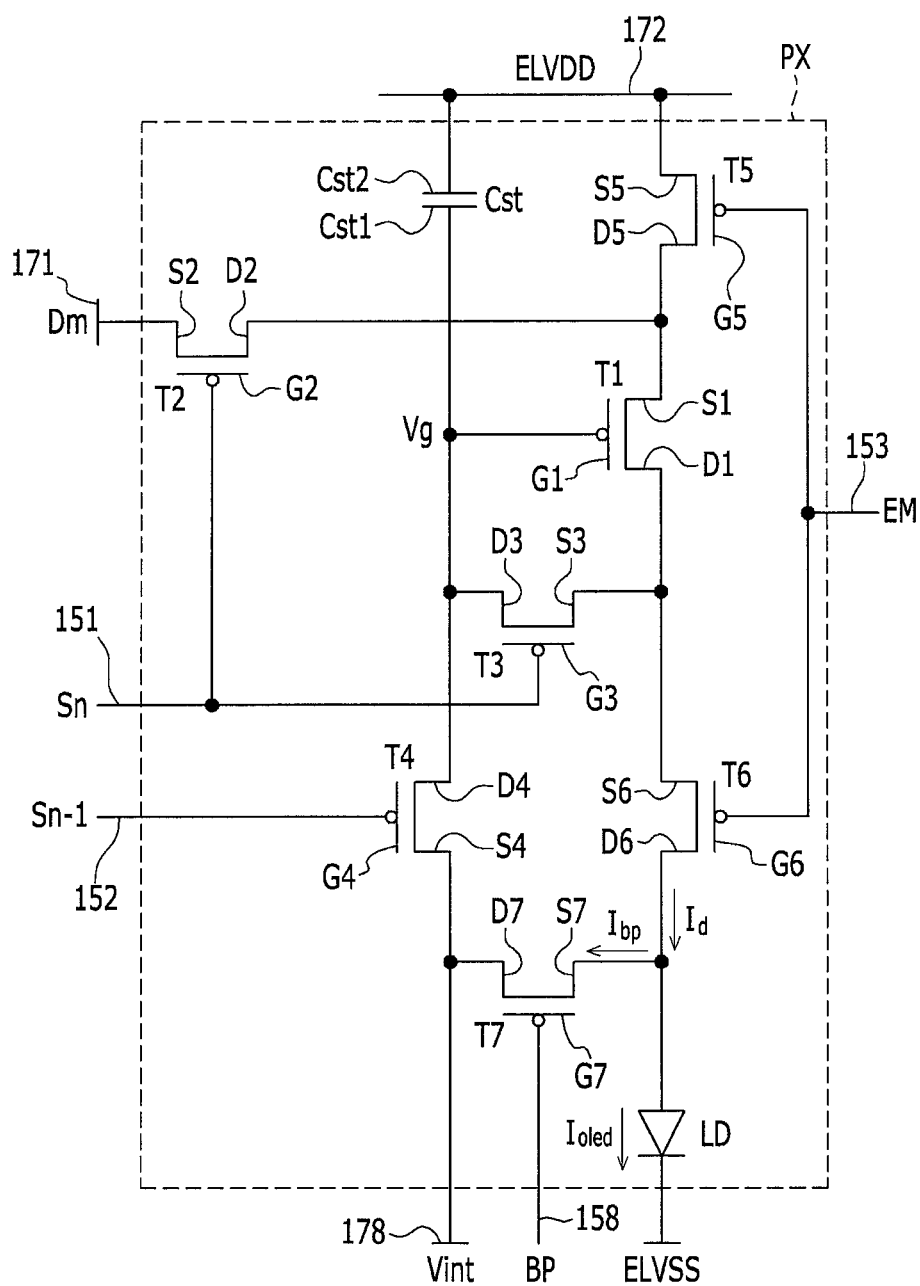
FIG. 6 is an equivalent circuit diagram of one pixel of an organic light emitting diode display according to some example embodiments of the present invention.

FIG. 6 is an equivalent circuit diagram of one pixel of an organic light emitting diode display according to an example embodiment of the present invention.

As shown in FIG. 6, the organic light emitting diode display according to an example embodiment of the present invention includes a plurality of signal lines 151, 152, 153, 158, 171, 172, and 178, and a plurality of pixels PX connected to the plurality of signal lines and substantially arranged in the form of a matrix.

One pixel PX includes a plurality of transistors T1, T2, T3, T4, T5, T6, and T7 connected to the plurality of signal lines 151, 152, 153, 158, 171, 172, and 178, a storage capacitor Cst, and an organic light emitting diode OLD.

The transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7.

The signal lines 151, 152, 153, 158, 171, 172, and 178 include a scan line 151 transferring a scan signal Sn, a previous scan line 152 transferring a previous scan signal Sn−1 to the initialization transistor T4, a light emission control line 153 transferring a light emission control signal EM to the operation control transistor T5 and the light emission control transistor T6, a bypass control line 158 transferring a bypass signal BP to the bypass transistor T7, a data line 171 crossing the scan line 151 and transferring a data signal Dm, a driving voltage line 172 transferring a driving voltage ELVDD and formed to be substantially parallel with the data line 171, and an initialization voltage line 178 transferring an initialization voltage Vint for initializing the driving transistor T1.

A gate electrode G1 of the driving transistor T1 is connected with one end Cst1 of the storage capacitor Cst, a source electrode S1 of the driving transistor T1 is connected with the driving voltage line 172 via the operation control transistor T5, and a drain electrode D1 of the driving transistor T1 is electrically connected with an anode of the organic light emitting diode OLD via the light emission control transistor T6. The driving transistor T1 receives the data signal Dm according to a switching operation of the switching transistor T2 to supply a driving current Id to the organic light emitting diode OLD.

A gate electrode G2 of the switching transistor T2 is connected with the scan line 151, a source electrode S2 of the switching transistor T2 is connected with the data line 171, and a drain electrode D2 of the switching transistor T2 is connected with the source electrode S1 of the driving transistor T1 and with the driving voltage line 172 via the operation control transistor T5. The switching transistor T2 is turned on according to the scan signal Sn received through the scan line 151 to perform a switching operation for transferring the data signal Dm transferred to the data line 171 to the source electrode of the driving transistor T1.

A gate electrode G3 of the compensation transistor T3 is directly connected with the scan line 151, a source electrode S3 of the compensation transistor T3 is connected to the drain electrode D1 of the driving transistor T1 and with an anode of the organic light emitting diode OLD via the emission control transistor T6, and a drain electrode D3 of the compensation transistor T3 is connected with one end Cst1 of the storage capacitor Cst and the drain electrode D4 of the initialization transistor T4, together with the gate electrode G1 of the driving transistor T1. The compensation transistor T3 is turned on according to the scan signal Sn received through the scan line 151 to connect the gate electrode G1 and the drain electrode D1 of the driving transistor T1 and diode-connect the driving transistor T1.

A gate electrode G4 of the initialization transistor T4 is connected with the previous scan line 152, a source electrode S4 of the initialization transistor T4 is connected with an initialization voltage line 178, and a drain electrode D4 of the initialization transistor T4 is connected with one end Cst1 of the storage capacitor Cst and the gate electrode G1 of the driving transistor T1 together through the drain electrode D3 of the compensation transistor T3. The initialization transistor T4 is turned on according to a previous scan signal Sn−1 received through the previous scan line 152 to transfer the initialization voltage Vint to the gate electrode G1 of the driving transistor T1, and then to perform an initialization operation of initializing a voltage of the gate electrode G1 of the driving transistor T1.

A gate electrode G5 of the operation control transistor T5 is connected with the light emission control line 153, a source electrode S5 of the operation control transistor T5 is connected with the driving voltage line 172, and a drain electrode D5 of the operation control transistor T5 is connected with the source electrode S1 of the driving transistor T1 and the drain electrode S2 of the switching transistor T2.

A gate electrode G6 of the emission control transistor T6 is connected to the light emission control line 153, the source electrode S6 of the first emission control transistor T6 is connected to the drain electrode D1 of the driving transistor T1 and the source electrode S3 of the compensation transistor T3, and the drain electrode D6 of the first emission control transistor T6 is electrically connected to the anode of the organic light emitting diode LD. The operation control transistor T5 and the first emission control transistor T6 are simultaneously turned on according to the emission control signal EM transmitted to the light emission control line 153 such that the driving voltage ELVDD is compensated through the diode-connected driving transistor T1 and is transmitted to the organic light emitting diode LD.

A gate electrode G7 of the thin film bypass transistor T7 is connected to the bypass control line 158, a source electrode S7 of the bypass thin film transistor T7 is connected to the drain electrode D6 of the light emission control thin film transistor T6 together with the anode of the organic light emitting diode OLD, and a drain electrode D7 of the bypass thin film transistor T7 is connected to the initialization voltage line 178 together with the source electrode S4 of the initialization thin film transistor T4.

In this case, the bypass control line 158 is connected to the previous scan line 152 such that the bypass signal BP is the same as the previous scan signal S(n−1). Also, the bypass signal BP may be connected to the second previous scan line S(n−2) such that the same scan signal as the second previous scan line Sn−2 may be input, or a separate bypass signal may be input. If the bypass transistor T7 is turned-on, the remaining current flowing to the first electrode of the organic light emitting element is discharged to the initialization transistor T4 through the bypass transistor T7, thereby suppressing the undesired emission of the organic light emitting element due to the remaining current flowing to the first electrode of the organic light emitting element.

The other end Cst2 of the storage capacitor Cst is connected with the driving voltage line 172, and the cathode of the organic light emitting diode LD is connected with a second electrode transmitting a common voltage ELVSS.

Meanwhile, in the example embodiment of the present invention, the seven transistor and one capacitor structure including the bypass transistor T7 is illustrated, but the present invention is not limited thereto, and the number of transistors and the number of capacitors may be variously changed.

Hereinafter, a detailed operation process of one pixel of the organic light emitting diode display according to the example embodiments of the present invention will be described in more detail with reference to FIG. 7.

Figure 7:
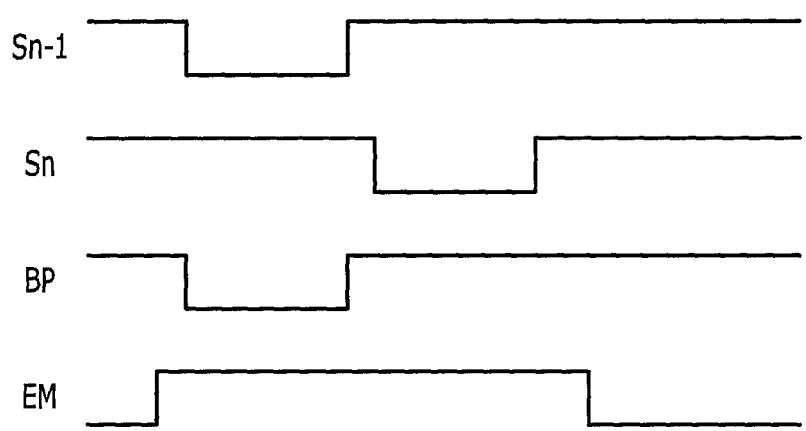
FIG. 7 is a timing diagram of signals applied to one pixel of an organic light emitting diode display according to some example embodiments of the present invention.

FIG. 7 is a timing diagram of a signal applied to one pixel of an organic light emitting diode display according to an example embodiment of the present invention.

As shown in FIG. 7, first, for an initializing period, the previous scan signal S(n−1) having a low level is supplied through the previous scan line 152. Then, the initializing thin film transistor T4 is turned on in response to the previous scan signal S(n−1) having the low level, the initial voltage Vint is connected to the gate electrode G1 of the driving transistor T1 from the initialization voltage line 178 through the initializing thin film transistor T4, and then the driving thin film transistor T1 is initialized by the initialization voltage Vint.

Thereafter, for a data programming period, the scan signal Sn having a low level is supplied through the scan line 151. Then, the switching thin film transistor T2 and the compensating thin film transistor T3 are turned on in response to the scan signal Sn having the low level. At this time, the driving transistor T1 is diode-connected through the turned-on compensation transistor T3 and is biased in a forward direction.

Then, a compensation voltage Dm+Vth (Vth is a negative (−) value) reduced by a threshold voltage Vth of the driving thin film transistor T1 from a data signal Dm supplied from the data line 171 is applied to the gate electrode G1 of the driving thin film transistor T1. That is, the gate voltage Vg applied to the gate electrode G1 of the driving transistor T1 becomes the compensation voltage (Dm+Vth). The driving voltage ELVDD and the compensation voltage (Dm+Vth) are applied to both terminals of the storage capacitor Cst, and a charge corresponding to a voltage difference between both terminals is stored in the storage capacitor Cst.

Next, during the emission period, the emission control signal EM supplied from the emission control line 153 is changed from the high level to the low level. Thus, the operation control transistor T5 and the emission control transistor T6 are turned on by the emission control signal EM of the low level during the emission period.

Therefore, a driving current Id is generated according to the voltage difference between the gate voltage of the gate electrode G1 of the driving transistor T1 and the driving voltage ELVDD, and the driving current Id is supplied to the organic light emitting diode LD through the emission control transistor T6. The gate-source voltage Vgs of the driving thin film transistor T1 is maintained as "(Dm+Vth)−ELVDD" by the storage capacitor Cst for the emission period, and according to a current-voltage relationship of the driving thin film transistor T1, the driving current Id is proportional to the square "(Dm−ELVDD)2" of a value obtained by subtracting the threshold voltage from the source-gate voltage. Accordingly, the driving current Id is determined regardless of the threshold voltage Vth of the driving thin film transistor T1.

In this case, the bypass transistor T7 is transmitted with the bypass signal BP from the bypass control line 158. Thus, the portion of the driving current Id is discharged as the bypass current Ibp through the bypass transistor T7.

When a minimum current of the driving transistor T1 displaying the black image flows as the driving current, if the organic light emitting diode (OLED) is also emitted, the black image is not normally displayed. Accordingly, the bypass transistor T7 of the organic light emitting diode display according to an example embodiment of the present invention may disperse the portion of the minimum current of the driving transistor T1 as the bypass current Ibp through the current path other than the current path of the organic light emitting diode side.

Here, the minimum current of the driving transistor T1 refers to the current in a condition that the driving transistor T1 is turned off because the gate-source voltage Vgs of the driving transistor T1 is smaller than the threshold voltage Vth. The minimum driving current (for example, a current of 10 pA or less) under the condition in which the driving transistor T1 is turned off is transferred to the organic light emitting diode LD to be expressed as an image with black luminance.

When the minimum driving current for expressing the black image flows, influence on bypass transfer of the bypass current Ibp may be large, but when a large driving current expressing an image such as a normal image or a white image flows, there may be little influence on the bypass current Ibp.

Accordingly, when the driving current displaying a black image flows, the light emission current Ioled of the organic light emitting diode OLED which is reduced by the current amount of the bypass current Ibp which flows out from the driving current Id through the bypass transistor T7 has a minimum current amount as a level which may exactly (or more accurately) express the black image. Therefore, a black luminance image may be exactly (or more accurately) implemented by using the bypass transistor T7, thereby improving contrast ratio. In FIG. 7, the bypass signal BP is the previous scan signal Sn−1, however it is not limited thereto.

Hereafter, a layered configuration of the organic light emitting diode display according to an example embodiment of the present invention will be described with reference to the accompanying drawings.

Figure 8A:
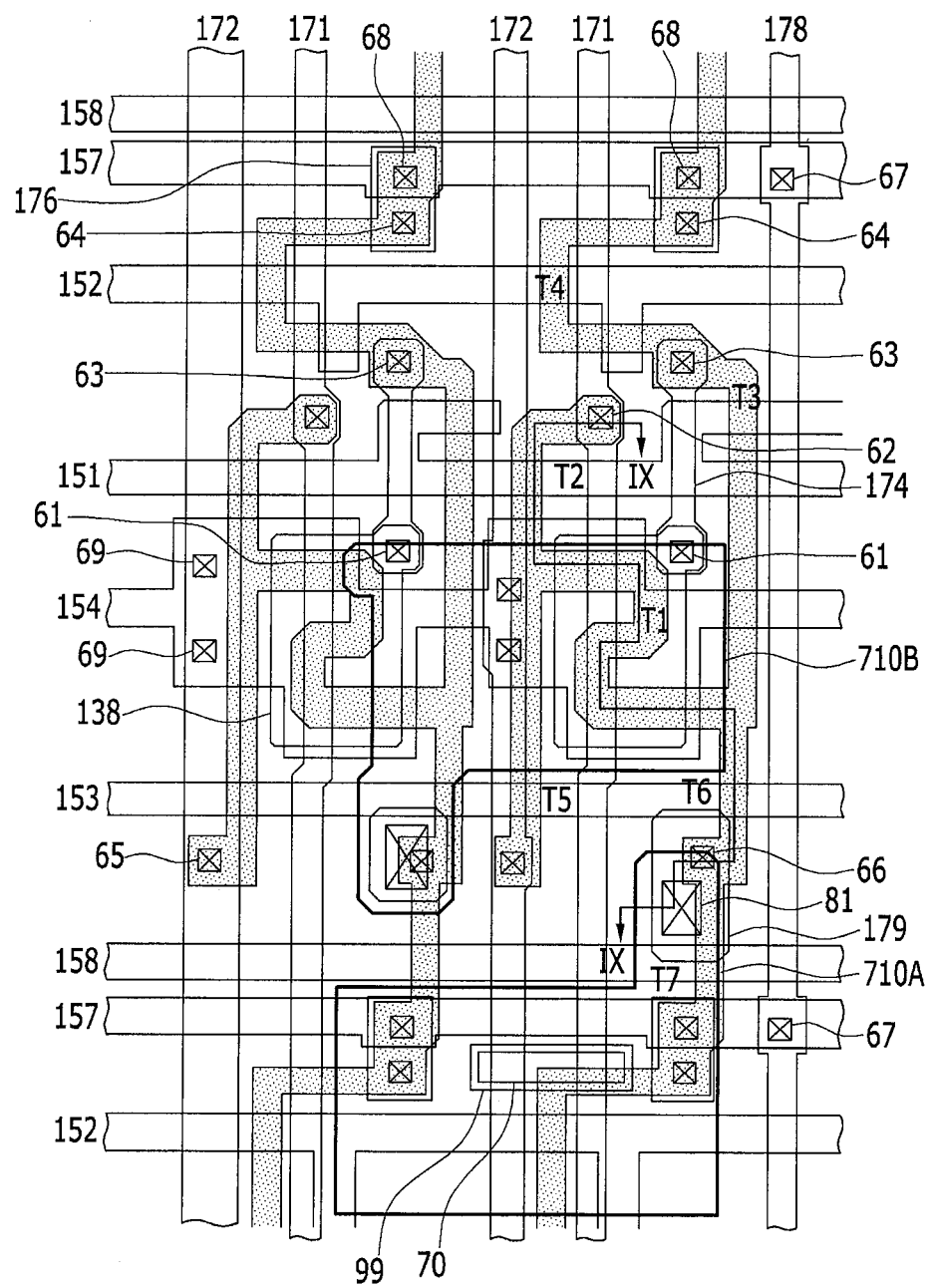
FIG. 8A is a layout view of a plurality of an organic light emitting diode display according to some example embodiments of the present invention.
Figure 8B:
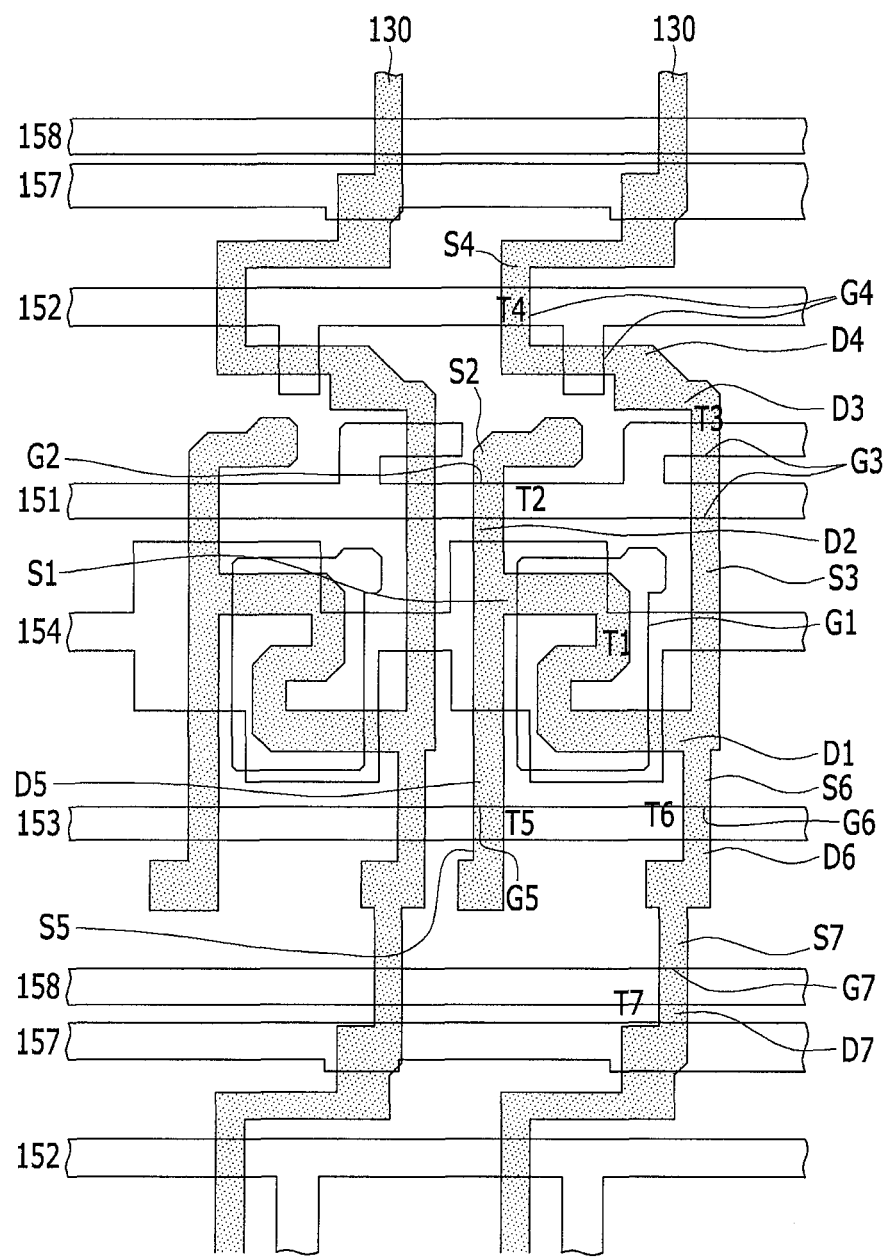
FIG. 8B is a layout view of a part of a semiconductor and a signal line shown in FIG. 8A.
Figure 9:
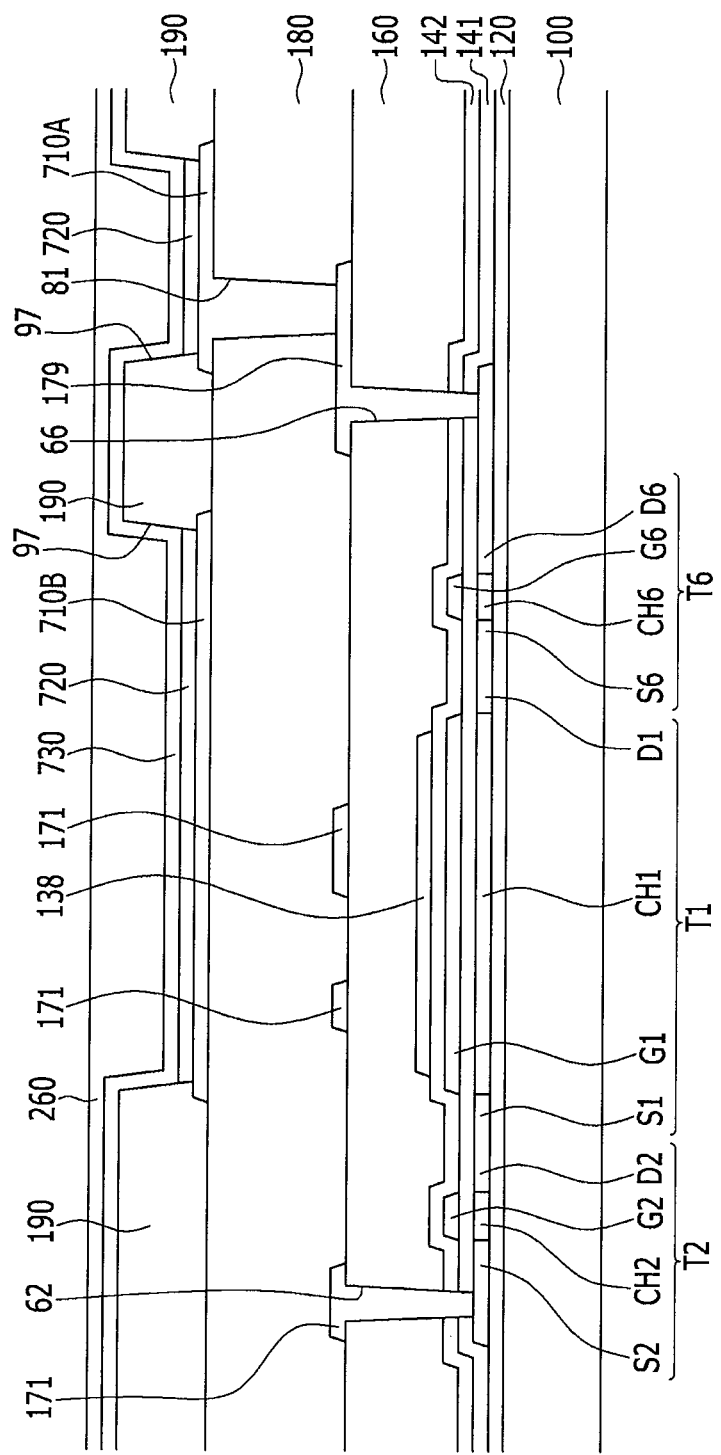
FIG. 9 is a cross-sectional view taken along the line IX-IX of FIG. 8A.

FIG. 8A is a layout view of a plurality of an organic light emitting diode display according to an example embodiment of the present invention, FIG. 8B is a layout view of a part of a semiconductor and a signal line shown in FIG. 8A, and FIG. 9 is a cross-sectional view taken along the line IX-IX of FIG. 8A.

Hereinafter, a detailed planar structure of the organic light emitting diode display according to the example embodiment of the present invention will first be described in detail with reference to FIG. 8A and FIG. 8B, and a detailed cross-sectional structure will be described in detail with reference to FIG. 9.

FIG. 8B only shows the semiconductor 130 and the scan line 151, the previous scan line 152, the light emission control line 153, the horizontal initialization voltage line 157, and the bypass control line 158 formed along the row direction in FIG. 8A, and the same reference numerals as in FIG. 8A are shown in FIG. 8B.

First, as shown in FIG. 8A and FIG. 8B, the organic light emitting diode display according to an example embodiment of the present invention includes the scan line 151, the previous scan line 152, the light emission control line 153, the horizontal initialization voltage line 157, and the bypass control line 158 respectively applying the scan signal Sn, the previous scan signal S(n−1), the light emission control signal EM, the initialization voltage Vint, and the bypass signal BP, and formed according to the row direction.

Also, the data line 171, the driving voltage line 172, and the initialization voltage line 178 crossing the scan line 151, the previous scan line 152, the light emission control line 153, the horizontal initialization voltage line 157, and the bypass control line 158 and respectively applying the data signal Dm, the driving voltage ELVDD, and the initialization voltage Vint to the pixel PX are included. In this case, the initialization voltage line 178 is connected to the horizontal initialization voltage line 157 through the contact hole and is formed of a mesh shape structure. Also, the initialization voltage Vint is transmitted from the initialization voltage line 178 to the compensation transistor T3 via the initialization transistor T4.

Further, the driving transistor T1, the switching transistor T2, the compensation transistor T3, the initialization transistor T4, the operation control transistor T5, the light emission control transistor T6, the bypass transistor T7, the storage capacitor Cst, and the organic light emitting diode LD are formed in the pixel PX. The organic light emitting diode LD is formed of the first electrodes 710A and 710B, the organic emission layer 720, and the second electrode 730. In this case, the compensation transistor T3 and the initialization transistor T4 may be configured as a transistor having a dual gate structure for blocking a current leakage.

A channel of each of the driving transistor T1, the switching transistor T2, the compensation transistor T3, the initialization transistor T4, the operation control transistor T5, the light emission control transistor T6, and the bypass transistor T7 is formed inside one connected semiconductor 130, and the semiconductor 130 may be formed to be curved in various forms.

The semiconductor 130 may be formed of polysilicon or an oxide semiconductor. The oxide semiconductor may include any one of the oxides having titanium (Ti), hafnium (Hf), zirconium (Zr), aluminum (Al), tantalum (Ta), germanium (Ge), zinc (Zn), gallium (Ga), tin (Sn), or indium (In) as a base, and complex oxides thereof, such as an indium-gallium-zinc oxide (InGaZnO4), indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O). When the semiconductor 130 is formed of the oxide semiconductor, a separate passivation layer may be added in order to protect the oxide semiconductor, which is weak in an external environment such as a high temperature environment.

The semiconductor 130 includes a channel which is doped with an N-type impurity or a P-type impurity, and a source doping area and a drain doping area formed at both sides of the channel and having a higher doping concentration than that of the doping impurity doped in the channel.

In the present example embodiment, the source doping area and the drain doping area correspond to a source electrode and a drain electrode, respectively. The source electrode and the drain electrode formed in the semiconductor 130 may be formed by doping only the corresponding areas. Further, an area between a source electrode and a drain electrode of different transistors in the semiconductor 130 is also doped, so that the source electrode and the drain electrode may be electrically connected with each other.

The channel formed in the semiconductor 130 includes a driving channel formed in the driving transistor T1, a switching channel formed in the switching transistor T2, a compensation channel formed in the compensation transistor T3, an initialization channel formed in the initialization transistor T4, an operation control channel formed in the operation control transistor T5, a light emission control channel formed in the light emission control transistor T6, and a bypass channel formed in the bypass transistor T7.

In this case, the channel may be formed in the semiconductor 130 overlapping the gate electrode of the transistor.

The driving transistor T1 includes the driving semiconductor including the driving channel, the driving gate electrode G1, the driving source electrode S1, and the driving drain electrode D1. The driving channel may be bent, and may have a meandering shape (e.g., a non-linear or curved shape) or a zigzag shape. As described above, the driving channel is formed in the bent shape, so that it is possible to elongate the driving channel within a narrow space.

Accordingly, a driving range of the driving gate-source voltage Vgs between the driving gate electrode G1 and the driving source electrode S1 is widened by the elongated driving channel. Therefore, because the driving range of the driving gate-source voltage Vgs is widened, a gray of light emitted from an organic light emitting diode LD may be more finely controlled by changing a size of the gate voltage Vg applied to the driving gate electrode G1, and as a result, it may be possible to increase resolution of the organic light emitting diode display and improve a display quality. Various example embodiments of the driving channel may be carried out by variously changing the shape of the driving channel, such as a shape of an "inverse S", a shape of an "S", a shape of an "M", and a shape of a "W".

The driving gate electrode G1 overlaps the driving channel, and the driving source electrode S1 and the driving drain electrode D1 are formed in the semiconductor 130 adjacent to both sides of the driving channel, respectively. The driving gate electrode G1 is connected to the driving connecting member 174 through the contact hole 61.

The switching transistor T2 includes the switching channel CH2, a switching gate electrode G2, a switching source electrode S2, and a switching drain electrode D2. The switching gate electrode G2 that is expanded from the scan line 151 downwardly overlaps the switching channel CH2, and the switching source electrode S2 and the switching drain electrode D2 are each formed in the semiconductor 130 adjacent to both sides of the switching channel, respectively. The switching source electrode S2 is connected to the data line 171 through the contact hole 62.

The compensation transistor T3 includes the compensation channel, a compensation gate electrode G3, a compensation source electrode S3, and a compensation drain electrode D3.

Two compensation gate electrodes G3 are formed in order to prevent a current leakage, and the two compensation gate electrodes G3 may be formed of the gate electrode that is a part of the scan line 151 and the gate electrode that is divided from the scan line 151 and then is again connected to the scan line 151. The compensation gate electrode G3 overlaps the compensation channel, and the compensation source electrode S3 and the compensation drain electrode D3 are formed in the semiconductor 130 adjacent to both sides of the compensation channel. The compensation drain electrode D3 is connected to the driving connecting member 174 through the contact hole 63.

The initialization transistor T4 includes the initialization channel, an initialization gate electrode G4, an initialization source electrode S4, and an initialization drain electrode D4. The initialization gate electrode G4 is formed in two to prevent a current from being leaked and the two initialization gate electrodes G4 may be formed of the gate electrode that is a part of the previous scan line 152 and the gate electrode that is extended and protruded downwardly from the previous scan line 152.

The initialization gate electrode G4 overlaps the initialization channel and the initialization source electrode S4 and the initialization drain electrode D4 are each formed in the semiconductor 130 adjacent to both sides of the initialization channel. The initialization source electrode S4 is connected to the initialization connecting member 176 through the contact hole 64, and the initialization drain electrode D4 is connected to the compensation drain electrode D3. The initialization connecting member 176 is connected to the horizontal initialization voltage line 157 through the contact hole 68.

The control transistor T5 includes the operation control channel, the operation control gate electrode G5, the operation control source electrode S5, and the operation control drain electrode D5. The operation control gate electrode G5 that is a part of the light emission control line 153 overlaps the operation control channel, and the operation control source electrode S5 and the operation control drain electrode D5 are each formed in the semiconductor 130 adjacent to both sides of the operation control channel. The operation control source electrode S5 is connected to a part of the driving voltage line 172 through a contact hole 65.

The light emission control transistor T6 includes the light emission control channel, a light emission control gate electrode G6, a light emission control source electrode S6, and a light emission control drain electrode D6. The light emission control gate electrode G6 that is a part of the light emission control line 153 overlaps the light emission control channel, and the light emission control source electrode S6 and the light emission control drain electrode D6 are each formed in the semiconductor 130 adjacent to both sides of the light emission control channel. The light emission control drain electrode D6 is connected to the light emission control connecting member 179 through the contact hole 66.

The bypass transistor T7 includes the bypass channel, a bypass gate electrode G7, a bypass source electrode S7, and a bypass drain electrode D7. The bypass gate electrode G7 is a part of the bypass control line 158 and overlaps the bypass channel, and the bypass source electrode S7 and the bypass drain electrode D7 are each formed in the semiconductor adjacent to both sides of the bypass channel. The bypass source electrode S7 is connected to the light emission control connecting member 179 through the contact hole 81, and the bypass drain electrode D7 is directly connected to the initialization source electrode S4.

One end of the driving channel of the driving transistor T1 is connected to the switching drain electrode D2 and the operation control drain electrode D5, and the other end of the driving channel is connected to the compensation source electrode S3 and the light emission control source electrode S6.

The storage capacitor Cst includes the first storage electrode and the second storage electrode 138 arranged via the second gate insulating layer 142. The first storage electrode corresponds the driving gate electrode G1, and the second storage electrode 138 as a part extended from the storage line 154 is occupied with a wider area than the driving gate electrode G1 and covers the overall driving gate electrode G1. Here, the second gate insulating layer 142 may be a dielectric material and storage capacitance is determined by a charge charged in the storage capacitor Cst and a voltage between both electrodes. As such, the driving gate electrode G1 is used as the first storage electrode, and thus a space in which the storage capacitor may be formed may be secured in a narrow space due to the driving channel occupying a large area within the pixel.

The driving connecting member 174 is elongated in a direction practically parallel to the data line 171 and is formed with the same layer as the data line 171. The other end of the driving connecting member 174 is connected to the compensation drain electrode D3 of the compensation transistor T3 and the initialization drain electrode D4 of the initialization transistor T4 through the contact hole 63. Accordingly, the driving connecting member 174 connects the driving gate electrode G1 and the compensation drain electrode D3 of the compensation transistor T3 and the initialization drain electrode D4 of the initialization transistor T4 to each other.

The storage line 154 is connected to the driving voltage line 172 through the contact hole 69. Accordingly, the capacitor Cst stores the storage capacitance corresponding to the difference between the driving voltage ELVDD transmitted to the second storage electrode 138 through the driving voltage line 172 and the storage line 154 and the driving gate voltage Vg of the driving gate electrode G1.

The initialization voltage line 178 extending parallel to the data line 171 is connected to the horizontal initialization voltage line 157 through the contact hole 67 and is connected to the initialization source electrode S4 through the initialization connecting member 176 and the contact holes 64 and 68.

The layered structure of one pixel among the plurality of pixels shown in FIG. 8A and FIG. 8B will be described with reference to FIG. 9 as well as FIG. 8A and FIG. 8B.

In this case, the switching transistor T1, the driving transistor T2, and the light emission control transistor T6 are mainly described, because the compensation transistor T3, the initialization transistor T4, and the operation control transistor T5 have the nearly the same layered structure as the switching transistor T1, the driving transistor T2, and the light emission control transistor T6, the detailed description of such is omitted.

A buffer layer 120 is formed on a substrate 100. The substrate 100 may be formed of an insulating substrate made of glass, quartz, ceramic, plastic, and the like, and the buffer layer 120 may serve to improve a characteristic of polycrystalline silicon and reduce stress applied to the substrate 100 by blocking impurities from the substrate 110 during a crystallization process of forming polysilicon.

The semiconductor 130, including the driving channel, the switching channel, the compensation channel, the initialization channel, the operation control channel, the light emission control channel, and the bypass channel, is formed on the buffer layer 120.

Among the semiconductor 130, the driving source electrode S1 and the driving drain electrode D1 are formed at both sides of the driving channel, and the switching source electrode S2 and the switching drain electrode D2 are formed at both sides of the switching channel. Also, the compensation source electrode S3 and the compensation drain electrode D3 are formed at both sides of the compensation channel, and the initialization source electrode S4 and the initialization drain electrode D4 are formed at both sides of the initialization channel. Also, the operation control source electrode S5 and the operation control drain electrode D5 are formed at both sides of the operation control channel S5, and the light emission control source electrode S6 and the light emission control drain electrode D6 are formed at both sides of the light emission control channel. Also, the bypass source electrode S7 and the bypass drain electrode D7 are formed at both sides of the bypass channel.

A first gate insulating layer 141 which is a first insulating layer is formed on the semiconductor 130 to cover the semiconductor 130. First gate wires 151, 152, 153, and 158, including a scan line 151 having a switching gate electrode G1 and a compensation gate electrode G3, a previous scan line 152 having an initialization gate electrode G4, a light emission control line 153 having an operation control gate electrode G5 and a light emission control gate electrode G6, a bypass control line 158 having a bypass gate electrode G7, and a driving gate electrode G1 connected to the first storage electrode Cst1 are formed on the first gate insulating layer 141.

The first gate wires 151, 152, 153, and 158 may be formed of a metal layer including one of molybdenum (Mo) and molybdenum alloy.

A second gate insulating layer 142 as a second insulating layer covering the first gate wires 151, 152, 153, and 158 and the first gate insulating layer 141 is formed thereon. The first gate insulating layer 141 and the second gate insulating layer 142 may be formed of silicon nitride (SiNx) or silicon oxide ($SiO_2$).

Second gate wires 154, 157, and 159, including a storage line 154 formed parallel to the scan line 151, a second storage electrode Cst2 as a part extended from the storage line 154, and a horizontal initialization voltage line 157 parallel to the scan line 151, are formed on the second gate insulating layer 142.

An interlayer insulating layer 160 as a third insulating layer is formed on the second gate insulating layer 142 and the second gate wires 154, 157, and 159. The interlayer insulating layer 160 may be formed of silicon nitride (SiNx) or silicon oxide (SiO2).

The interlayer insulating layer 160 has contact holes 67, 68, and 69, the interlayer insulating layer 160 and the second gate insulating layer 142 have contact holes 61 and 64, and the interlayer insulating layer 160, the second gate insulating layer 142, and the first gate insulating layer 141 have contact holes 62, 63, 65, and 66. Data wires 171, 172, 174, 176, 178, and 179, including a data line 171, a driving voltage line 172, a driving connecting member 174, an initialization connecting member 176, an initialization voltage line 178, and a light emission control connecting member 179, are formed on the interlayer insulating layer 160.

The data line 171 is connected to the switching source electrode S2 through the contact hole 62, one end of the driving connecting member 174 is connected to the driving gate electrode G1 connected to the first storage electrode through the contact hole 61, and the compensation drain electrode D3 and the initialization drain electrode D4 are connected through the contact hole 63 of the driving connecting member 174.

The initialization voltage line 178 is connected to the horizontal initialization voltage line 157 through the contact hole 67, and the initialization connecting member 176 is connected to the horizontal initialization voltage line 157 and the initialization source electrode S4 through the contact holes 64 and 68.

Also, the light emission control connecting member 179 is connected to the light emission control drain electrode D6 through the contact hole 66.

The data wires 171, 172, 174, 176, 178, and 179 may be formed of a triple layer of titanium/aluminum/titanium (Ti/Al/Ti), molybdenum/aluminum/molybdenum (Mo/Al/Mo), or molybdenum/copper/molybdenum (Mo/Cu/Mo).

A passivation layer 180 covering the data wires 171, 172, 174, 176, 178, and 179 and the interlayer insulating layer 160 is formed thereon. The passivation layer 180 may be formed of an organic layer.

First electrodes 710A and 710B are formed on the passivation layer 180. The light emission control connecting member 179 is connected to the first electrodes 710A and 710B through the contact hole 81 formed in the passivation layer 180. The first electrodes 710A and 710B may be arranged to have the first electrode of FIG. 4, and the first electrodes 710A and 710B of FIG. 8 may be the first electrode 711 and 713 of the first pixel and the second pixel of FIG. 4.

A pixel definition layer (PDL) 190 covering the edge of the passivation layer 180 and the first electrodes 710A and 710B is formed thereon, and the pixel definition layer 190 has a pixel opening 97 exposing the first electrodes 710A and 710B. The pixel definition layer 190 may be made of a polyacrylate resin and a polyimide resin or silica-series inorganic materials.

An organic emission layer 720 is formed on the first electrodes 710A and 710B exposed by the pixel opening 97, and a second electrode 730 is formed on the organic emission layer 720. The second electrode 730 is also formed on the pixel definition layer 190, thereby being formed throughout the plurality of pixels. As described above, the organic light emitting diode LD including the first electrodes 710A and 710B, the organic emission layer 720, and the second electrode 730 is formed.

Herein, the first electrodes 710A and 710B are anodes, which are hole injection electrodes, and the second electrode 730 is a cathode, which is an electron injection electrode. However, the example embodiment according to the present invention is not necessarily limited thereto, and the first electrodes 710A and 710B may be cathodes and the second electrode 730 may be the anode according to a driving method of the organic light emitting diode display. When holes and electrons are respectively injected into the organic emission layer 370 from the first electrodes 710A and 710B and the second electrode 730, and excitons acquired by combining the injected holes and electrons fall from an excitation state to a ground state, light is emitted.

The organic emission layer 720 is made of a low-molecular organic material or a high-molecular organic material such as poly(3,4-ethylenedioxythiophene) (PEDOT). Further, the organic emission layer 720 may be formed with multiple layers including at least one of an emission layer, a hole injection layer (HIL), a hole transporting layer (HTL), an electron transporting layer (ETL), and an electron injection layer (EIL). When the organic emission layer 720 includes all of the layers, the hole injection layer is arranged on the first electrodes 710A and 710B, which are positive electrodes, and the hole transporting layer, the emission layer, the electron transporting layer, and the electron injection layer are sequentially laminated thereon.

The organic emission layer 720 may include a red organic emission layer emitting red light, a green organic emission layer emitting green light, and a blue organic emission layer emitting blue light, and the red organic emission layer, the green organic emission layer, and the blue organic emission layer are formed at a red pixel, a green pixel, and a blue pixel, respectively, to implement color images.

Further, in the organic emission layer 720, all of the red organic emission layer, the green organic emission layer, and the blue organic emission layer are laminated together on the red pixel, the green pixel, and the blue pixel, and a red color filter, a green color filter, and a blue color filter are formed for each pixel to implement the color images.

As another example, a white organic emission layer emitting white light is formed on all of the red pixel, the green pixel, and the blue pixel, and the red color filter, the green color filter, and the blue color filter are formed for each pixel to implement the color images. When the color images are implemented by using the white organic emission layer and the color filters, a deposition mask for depositing the red organic emission layer, the green organic emission layer, and the blue organic emission layer on individual pixels (e.g., the red pixel, the green pixel, and the blue pixel) may not be used.

The white organic emission layer described in another example may be formed as one organic emission layer, and may include a configuration that may emit white light by laminating a plurality of organic emission layers. As an example, the white organic emission layer may include a configuration that enables the white light to be emitted by combining at least one yellow organic emission layer and at least one blue organic emission layer, a configuration that enables the white light to be emitted by combining at least one cyan organic emission layer and at least one red organic emission layer, a configuration that enables the white light to be emitted by combining at least one magenta organic emission layer and at least one green organic emission layer, and the like.

An encapsulation member protecting the organic light emitting diode LD may be formed on the common electrode 730, and the encapsulation member may be sealed to the substrate 100 by a sealant and may be formed of various materials, such as, glass, quartz, ceramic, plastic, and metal. On the other hand, a thin film encapsulation layer may be formed on the second electrode 730 by depositing the inorganic layer and the organic layer with the usage of the sealant.

Figure 10:
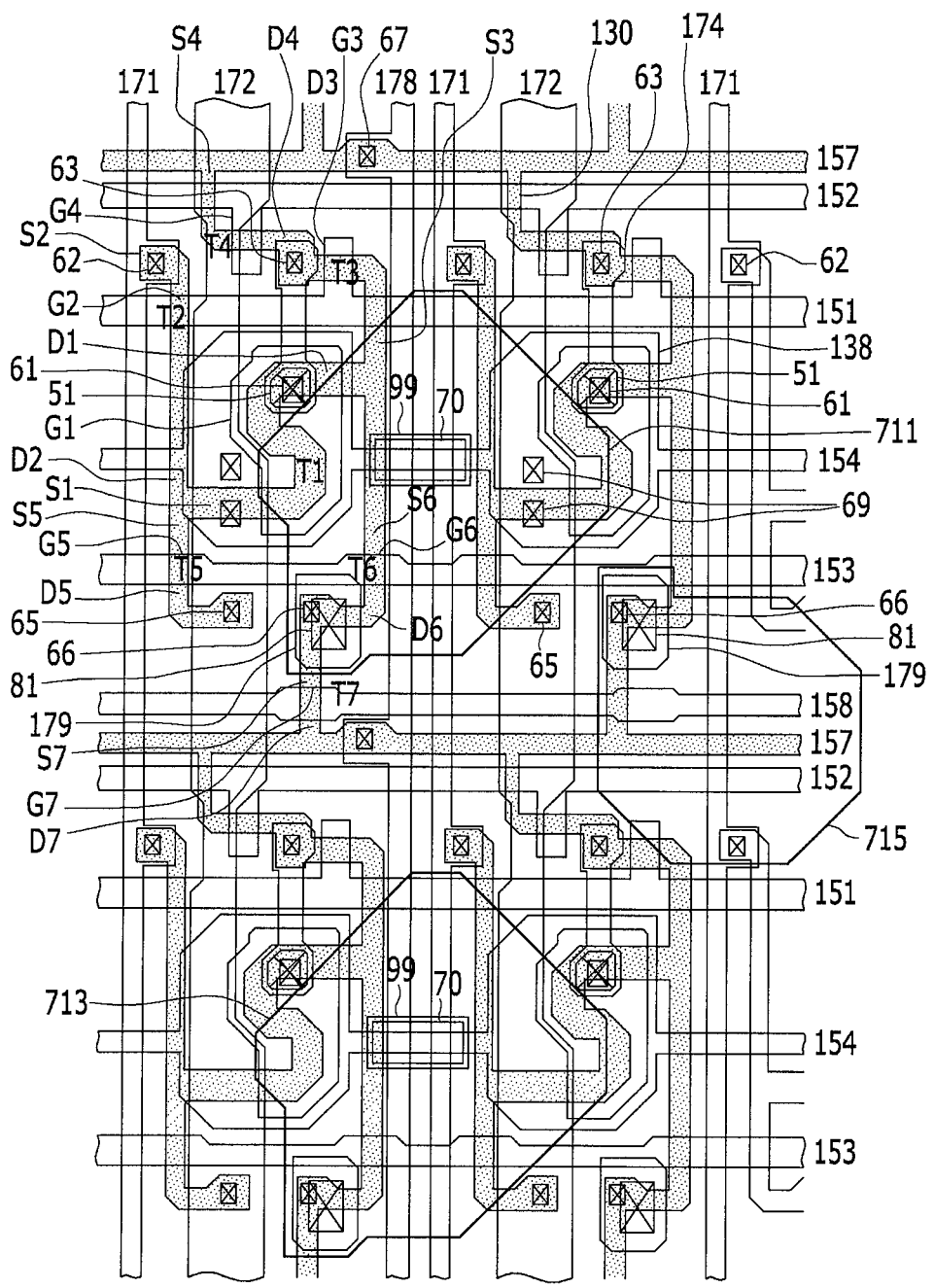
FIG. 10 is a layout view of an organic light emitting diode display according to some example embodiments of the present invention.

FIG. 10 is a layout view of an organic light emitting diode display according to another example embodiment of the present invention.

Most of the organic light emitting diode display of FIG. 10 is substantially the same as that of FIG. 8A, FIG. 8B and FIG. 9, such that a duplicate description is omitted.

As shown in FIG. 10, the organic light emitting diode display according to an example embodiment of the present invention includes the plurality of signal lines and the plurality of pixels connected to the plurality of signal lines and arranged approximately in the matrix shape, and each pixel includes the plurality of transistors, the storage capacitor, and the organic light emitting diode LD that are connected to the plurality of signal lines. The organic light emitting diode includes the first electrode, the organic emission layer formed on the first electrode, and the second electrode formed on the organic emission layer. In this case, the first electrode, as shown in FIG. 5, consists of first electrodes 711, 713, and 715 arranged to achieve a pentile matrix.

The transistors T1, T2, T3, T4, T5, T6, and T7 include the driving transistor T1, the switching transistor T2, the compensation transistor T3, the initialization transistor T4, the operation control transistor T5, the light emission control transistor T6, and the bypass transistor T7.

A channel of each of the driving transistor T1, the switching transistor T2, the compensation transistor T3, the initialization transistor T4, the operation control transistor T5, the light emission control transistor T6, and the bypass transistor T7 is formed inside one connected semiconductor 130, and the semiconductor 130 may be formed to be curved in various forms.

The signal lines include the scan line 151, the previous scan line 152, the light emission control line 153, the bypass control line 158, and the horizontal initialization voltage line 157, respectively applying the scan signal Sn, the previous scan signal Sn−1, the light emission control signal EM, and the bypass signal BP, and the initialization voltage Vint, and formed according to the row direction.

Also included are the data line 171, the driving voltage line 172, and the initialization voltage line 178 crossing the scan line 151, the previous scan line 152, the light emission control line 153, the horizontal initialization voltage line 157, and the bypass control line 158, and respectively applying the data signal Dm, the driving voltage ELVDD, and the initialization voltage Vint to the pixel PX. In this case, the initialization voltage line 178 is connected to the horizontal initialization voltage line 157 through the contact hole 67 and is formed of a mesh shape structure.

Meanwhile, the horizontal initialization voltage line 157 may be formed of the same material and layer as the semiconductor 130, and the semiconductor 130 may be connected to the horizontal initialization voltage line 157.

The horizontal initialization voltage line 157 may be formed along with the source region and the drain region and are doped with the same impurity as the source region and the drain region to be the heavily doped region. Accordingly, the initialization source electrode S4 may be directly connected to the horizontal initialization voltage line 157 without the separate initialization connecting member.

The second storage electrode 138 may be formed to overlap the driving gate electrode G1. Accordingly, when the second storage electrode overlaps the driving gate electrode, to connect the driving gate electrode G1 and the driving connecting member 174 through the contact hole 61, the second storage electrode 138 may have the opening 51 exposing the driving gate electrode G1.

The driving connecting member 174 is connected to the driving gate electrode G1 through the contact hole 61 and the opening 51, and according to some example embodiments, the opening 51 is formed to be larger than the contact hole 61.

Next, a method of repairing the described organic light emitting diode display will be described with reference to accompanying drawings.

Figure 11:
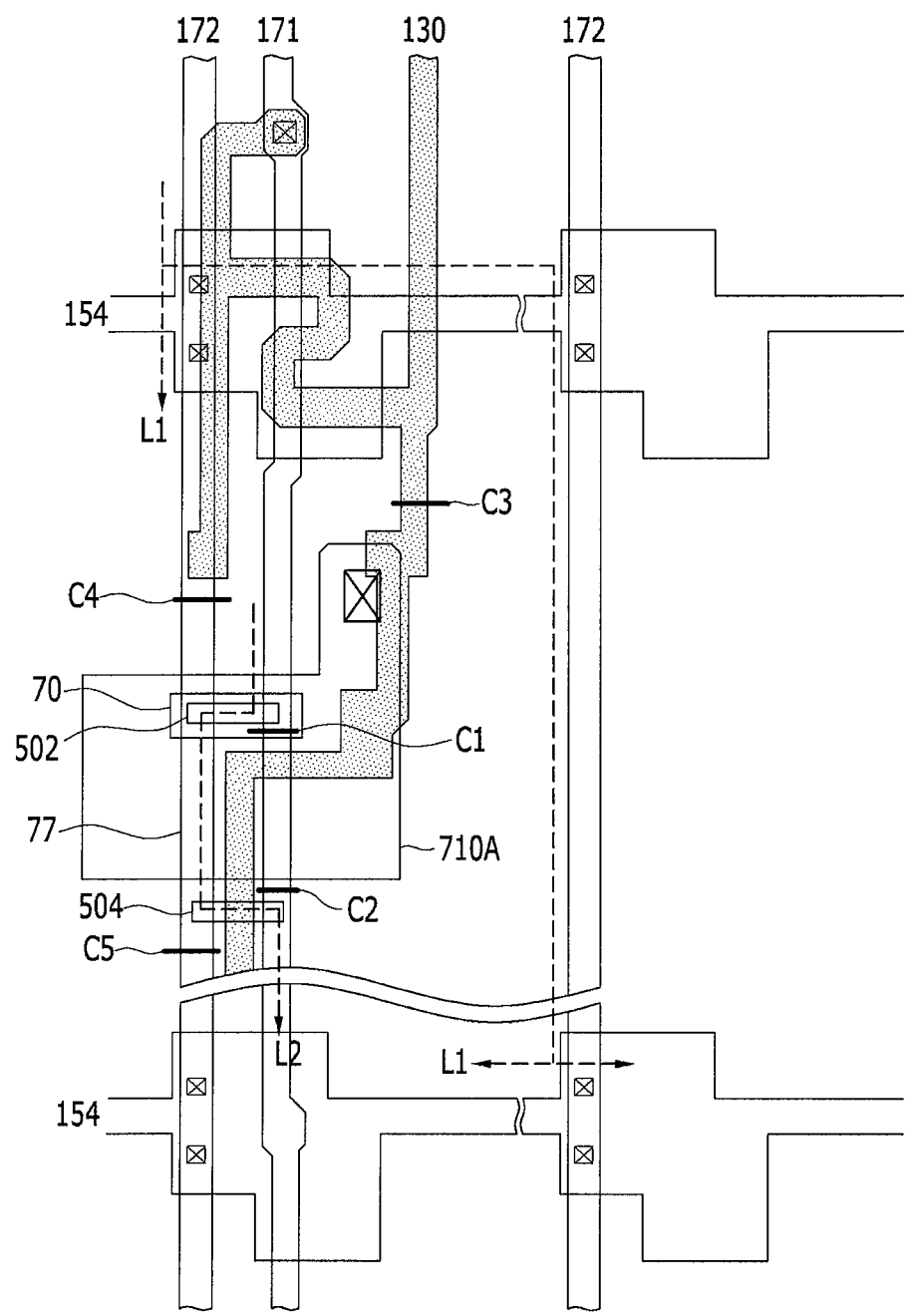
FIG. 11 is a view to explain a method of repairing a defective pixel according to some example embodiments of the present invention.

FIG. 11 is a view showing a method of repairing a defective pixel according to an example embodiment of the present invention.

The repair method according to the present invention blocks the signals applied to the defective pixel for the defective pixel to be the black pixel. In FIG. 11, the pixel arrangement shown in FIG. 8A and FIG. 8B is described as an example, and in this case, the pixel connected to the first electrode 710A connected to the right pixel is referred to as the defective pixel.

As shown in FIG. 11, in the first electrode 710A, the boundary line of the cutout 70 is positioned within the boundary line of the first electrode 710A. The cutout 70 overlaps the data line 171 and the driving voltage line 172.

Also, the driving voltage line 172 is connected to the storage line 154 through the contact hole, thereby forming the mesh shape.

The repair method of the organic light emitting diode display having the above pixel arrangement applies the signal after first forming the data line to test the defect of the pixel. In this case, the data line 171 and underlying storage line 154 may short circuit, such that the defective pixel is generated, or the data line and the adjacent driving voltage line may short circuit due to particles and become defective.

In this regard, if the defective pixel is confirmed, the signal line connected to the defective pixel is disconnected to not apply the signal to drive the pixel, thereby performing the repair process making the defective pixel into the black pixel.

For example, to make the defective pixel to be the black pixel, first the data line 171 connected to the defective pixel is disconnected, for example, by using a laser.

In this case, the first position C1 and the second position C2 positioned adjacent to the first electrode 710A are disconnected to isolate the data line 171 crossing the first electrode 710A of the defective pixel.

Also, to not apply the signal to the light emission control transistor connected to the first electrode 710A, the third position C3 connected to the drain electrode D6 of the light emission control transistor is disconnected, for example, by using the laser.

Accordingly, if the first to third positions C1, C2, and C3 are disconnected, the signal applied to the defective pixel is completely blocked such that the defective pixel is furthermore not emitted to be the black pixel.

Next, to repair the defective pixel by using the portion of the driving voltage line 172, the detour path passing the data signal is formed to connect the divided data line.

That is, by disconnecting the fourth position C4 and the fifth position C5 of the driving voltage line 172 positioned near the defective pixel, a detour pattern 77 in which the portion of the driving voltage line is separated from the driving voltage line is formed.

Because the driving voltage line is electrically connected to the horizontal driving voltage line to be the mesh shape, although the detour pattern 77 is formed, the driving voltage is moved along with the horizontal driving voltage line of the mesh shape structure (L1), thereby the driving voltage may be applied to the pixels other than the defective pixel.

Next, a first connection bridge 502 and a second connection bridge 504 connecting the detour pattern 77 and the data line 171 are formed. The first connection bridge 502 and the second connection bridge 504 may be formed by sputtering tungsten. In this case, the first connection bridge 502 is formed to be connected to the data line 171 exposed by the cutout 70 of the first electrode 710A.

Accordingly, by forming the first connection bridge 502 and the second connection bridge 504, the data signal transmitted along with the data line 171 is not applied to the defective pixel and then the data signal is transmitted to the pixel next to the defective pixel through the first connection bridge 502, the detour pattern 77, and the second connection bridge 504 (L2).

If the repair process for the defective pixel is completed, the passivation layer 180 having the contact hole is formed and the first electrode is formed on the passivation layer.

In this case, the cutout 70 of the first electrode 710A is formed to correspond to the portion in which the first connection bridge 502 and the data line 171 are connected.

As described above, by positioning the cutout 70 of the first electrode 710A to the portion in which the data line 171 and the first connection bridge 502 overlap, although the first connection bridge 502 is over-deposited so that it protrudes, the first electrode 710A and the first connection bridge 502 may be prevented from being short-circuited. If the first connection bridge 502 protrudes due to the over-deposit, the first electrode 710A and the first connection bridge 502 are short-circuited such that the data signal is directly applied to the first electrode 710A, thereby the defective pixel may be the bright point.

However, as described in the present invention, by forming the cutout 70, the first electrode 710A and the first connection bridge 502 are not short-circuited such that it may prevent or reduce instances of the defective pixel becoming the bright point.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims, and their equivalents.

DESCRIPTION OF SOME OF THE SYMBOLS 51, 91, 93, 95, 97: opening
61, 61, 63, 64, 65, 66, 67, 68, 69, 81: contact hole
70: cutout
100: substrate
130: semiconductor
141: first gate insulating layer
142: second gate insulating layer
151: scan line
153: light emission control line
157: horizontal initialization voltage line
160: interlayer insulating layer
171: data line
174: driving connecting member
179: control connecting member
190: pixel definition layer
504: second connection bridge
710A, 710B, 711, 713, 715: first electrode
720: organic emission layer
99: island pixel definition layer
120: buffer layer
138: second storage electrode
152: previous scan line
154: storage line
158: bypass control line
180: passivation layer
172: driving voltage line
176: initialization connecting member
178: initialization voltage line
502: first connection bridge
730: second electrode

What is claimed is:

1. An organic light emitting diode display comprising:
a substrate;
a scan line and a data line that are insulated from one another and crossing each other on the substrate;
a first transistor on the substrate and connected to the scan line and the data line;
a second transistor connected to the first transistor;
a first electrode connected to the second transistor and having a cutout;
an organic emission layer on the first electrode; and
a second electrode on the organic emission layer,
wherein the cutout is at a position corresponding to the data line to overlap with a portion of the data line, and an entire width of the data line is at the portion overlapping with the cutout.

2. The organic light emitting diode display of claim 1, further comprising:
a pixel definition layer on the second transistor and having an opening exposing the first electrode,
wherein the pixel definition layer overlaps the cutout and the organic emission layer is positioned in the opening.

3. The organic light emitting diode display of claim 1, wherein:
the cutout is concave from one edge of the first electrode to a center of the first electrode.

4. The organic light emitting diode display of claim 1, wherein a boundary line of the cutout is in a boundary line of the first electrode.

5. The organic light emitting diode display of claim 1, further comprising:
a driving voltage line or an initialization voltage line on the substrate and extending in a direction parallel to the data line,
wherein the cutout corresponds to the driving voltage line or the initialization voltage line.

6. The organic light emitting diode display of claim 5, wherein:
the driving voltage line or the initialization voltage line forms a mesh shape structure.

7. An organic light emitting diode display comprising:
a substrate including a plurality of pixels;
a scan line and a data line insulated from one another and crossing each other on the substrate;
a first transistor connected to the scan line and the data line formed in each pixel;
a driving voltage line separated from the scan line and the data line and arranged in a mesh shape;
a second transistor formed in each pixel and connected to the first transistor and the driving voltage line;
a first electrode connected to the second transistor and having a cutout at a position corresponding to the data line;
an organic emission layer on the first electrode; and
a second electrode on the organic emission layer,
wherein the first electrode of at least one pixel among the pixels is electrically isolated from the second transistor, the data line overlapping the first electrode has a first position and a second position configured to be divided by a laser, the driving voltage line connected to the second transistor has a third position and a fourth position configured to be divided by a laser, and both ends of a detour pattern positioned between the third position and the fourth position are respectively configured to be electrically connected to ends of the data line positioned at the first position and the second position by a first connection bridge and a second connection bridge.

8. The organic light emitting diode display of claim 7, wherein:
the first connection bridge and the second connection bridge are formed of tungsten.

9. The organic light emitting diode display of claim 7, wherein a portion in which one end of the first connection bridge and one end of the data line are configured to be connected is at the cutout.

10. An organic light emitting diode display comprising:
a substrate;
a scan line and a data line that are insulated from one another and crossing each other on the substrate;
a first transistor on the substrate and connected to the scan line and the data line;
a second transistor connected to the first transistor;
a first electrode connected to the second transistor and having a cutout;
an organic emission layer on the first electrode; and
a second electrode on the organic emission layer,
wherein the cutout is at a position corresponding to the data line, and
wherein the cutout is concave from one edge of the first electrode to a center of the first electrode.

* * * * *